(12) United States Patent
Takemoto

(10) Patent No.: US 12,419,047 B2
(45) Date of Patent: Sep. 16, 2025

(54) SEMICONDUCTOR DEVICE AND SEMICONDUCTOR DEVICE MANUFACTURING METHOD

(71) Applicant: Kioxia Corporation, Tokyo (JP)

(72) Inventor: Yasuo Takemoto, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 696 days.

(21) Appl. No.: 17/683,040

(22) Filed: Feb. 28, 2022

(65) Prior Publication Data

US 2022/0384468 A1    Dec. 1, 2022

(30) Foreign Application Priority Data

May 28, 2021   (JP) .................................. 2021-090138

(51) Int. Cl.
*H10B 41/41*    (2023.01)
*H10B 41/43*    (2023.01)
*H10B 41/49*    (2023.01)

(52) U.S. Cl.
CPC ............. *H10B 41/41* (2023.02); *H10B 41/43* (2023.02); *H10B 41/49* (2023.02)

(58) Field of Classification Search
CPC ........ H10B 41/41; H10B 41/43; H10B 41/49; H10B 80/00; H01L 24/13; H01L 24/29; H01L 24/92; H01L 24/83; H01L 24/16; H01L 24/48; H01L 24/73; H01L 24/81; H01L 2224/16225; H01L 2224/2919; H01L 2224/32225; H01L 2224/48095; H01L 24/32; H01L 25/0657; H01L 25/18; H01L 25/50; H01L 2224/32145;
(Continued)

(56) References Cited

U.S. PATENT DOCUMENTS 10,756,060 B2    8/2020  Uchida et al.
2012/0153432 A1*  6/2012  Karakane ............ H01L 25/0657
                                                    438/118
(Continued)

FOREIGN PATENT DOCUMENTS

JP    2003226857 A  *  8/2003
JP    2004-030420 A    1/2004
(Continued)

*Primary Examiner* — Raj R Gupta
(74) *Attorney, Agent, or Firm* — Foley & Lardner LLP

(57) ABSTRACT

A semiconductor device includes: a substrate; a first semiconductor chip; a first adhesive layer; a second semiconductor chip; a second adhesive layer; and a spacer. The substrate has a first surface. The first semiconductor chip is provided above the first surface. The first adhesive layer is provided on a lower surface, which is opposed to the substrate, of the first semiconductor chip and contains a plurality of types of resins different in molecular weight. The second semiconductor chip is provided between the substrate and the first adhesive layer. The second adhesive layer covers surroundings of the second semiconductor chip in a view from a normal direction of a first surface, and contains at least one type of the resin lower in molecular weight than the other resins among the plurality of types of resins contained in the first adhesive layer. The spacer covers surroundings of the second adhesive layer in the view from the normal direction of the first surface.

13 Claims, 7 Drawing Sheets

(58) Field of Classification Search
CPC . H01L 2224/48145; H01L 2224/48227; H01L 2224/73204; H01L 2224/73253; H01L 2224/73265; H01L 2224/81801; H01L 2224/8314; H01L 2224/83191; H01L 2224/8385; H01L 2224/92125; H01L 2225/06506; H01L 2225/0651; H01L 2225/06562; H01L 2225/06575; H01L 2924/00014; H01L 2924/1431; H01L 2924/1434; H01L 2924/15311; H01L 2924/181; H01L 21/56; H01L 23/16; H01L 23/3114; H01L 23/3142

See application file for complete search history.

(56) References Cited

U.S. PATENT DOCUMENTS

| | | | |
|---|---|---|---|
| 2013/0244401 A1* | 9/2013 | Tsuchiyama | C09J 133/24 |
| | | | 523/400 |
| 2020/0020669 A1* | 1/2020 | Uchida | H01L 25/105 |
| 2020/0083204 A1 | 3/2020 | Tam | |
| 2021/0082895 A1* | 3/2021 | Miura | H01L 24/16 |
| 2022/0059493 A1* | 2/2022 | Okada | H01L 24/83 |

FOREIGN PATENT DOCUMENTS

| | | |
|---|---|---|
| JP | 2020-009983 A | 1/2020 |
| JP | 2020-043258 A | 3/2020 |
| TW | 202006907 A | 2/2020 |
| TW | 202010788 A | 3/2020 |
| TW | 202114083 A | 4/2021 |

* cited by examiner

SEMICONDUCTOR DEVICE AND SEMICONDUCTOR DEVICE MANUFACTURING METHOD

CROSS-REFERENCE TO RELATED APPLICATION(S)

This application is based upon and claims the benefit of priority from No. 2021-090138, filed May 28, 2021, the entire contents of which are incorporated herein by reference.

FIELD

Embodiments described herein relate generally to a semiconductor device and a semiconductor device manufacturing method.

BACKGROUND

A structure in which, for example, memory chips are stacked on a controller chip flip-chip connected to a substrate is known in semiconductor device packaging processes. However, it has been often difficult to appropriately provide the memory chips on the substrate depending on, for example, a chip size relationship between the controller chip and the memory chips.

DETAILED DESCRIPTION

Embodiments provide a semiconductor device and a semiconductor device manufacturing method capable of providing chips on a substrate more appropriately.

In general, according to at least one embodiment, a semiconductor device includes: a substrate; a first semiconductor chip; a first adhesive layer; a second semiconductor chip; a second adhesive layer; and a spacer. The substrate has a first surface. The first semiconductor chip is provided above the first surface. The first adhesive layer is provided on a lower surface, which is opposed to the substrate, of the first semiconductor chip and contains a plurality of types of resins different in molecular weight. The second semiconductor chip is provided between the substrate and the first adhesive layer. The second adhesive layer covers surroundings of the second semiconductor chip in a view from a normal direction of a first surface, and contains at least one type of the resin lower in molecular weight than the other resins among the plurality of types of resins contained in the first adhesive layer. The spacer covers surroundings of the second adhesive layer in the view from the normal direction of the first surface.

Embodiments of the disclosure will be described hereinafter with reference to the drawings. It is to be noted that the present embodiments are not intended to limit the disclosure. In the following embodiments, a vertical direction of an interconnection substrate indicates a relative direction when a surface on which a semiconductor chip is provided is assumed as an upper surface and often differs from a vertical direction according to a gravitational acceleration. The drawings are either schematic or conceptual and proportions and the like of elements are not necessarily identical to actual proportions and the like. In the specification and the drawings, similar elements to those described previously with respect to the drawings already referred to are denoted by the same reference signs and detailed descriptions thereof are omitted as appropriate.

First Embodiment

Figure 1:
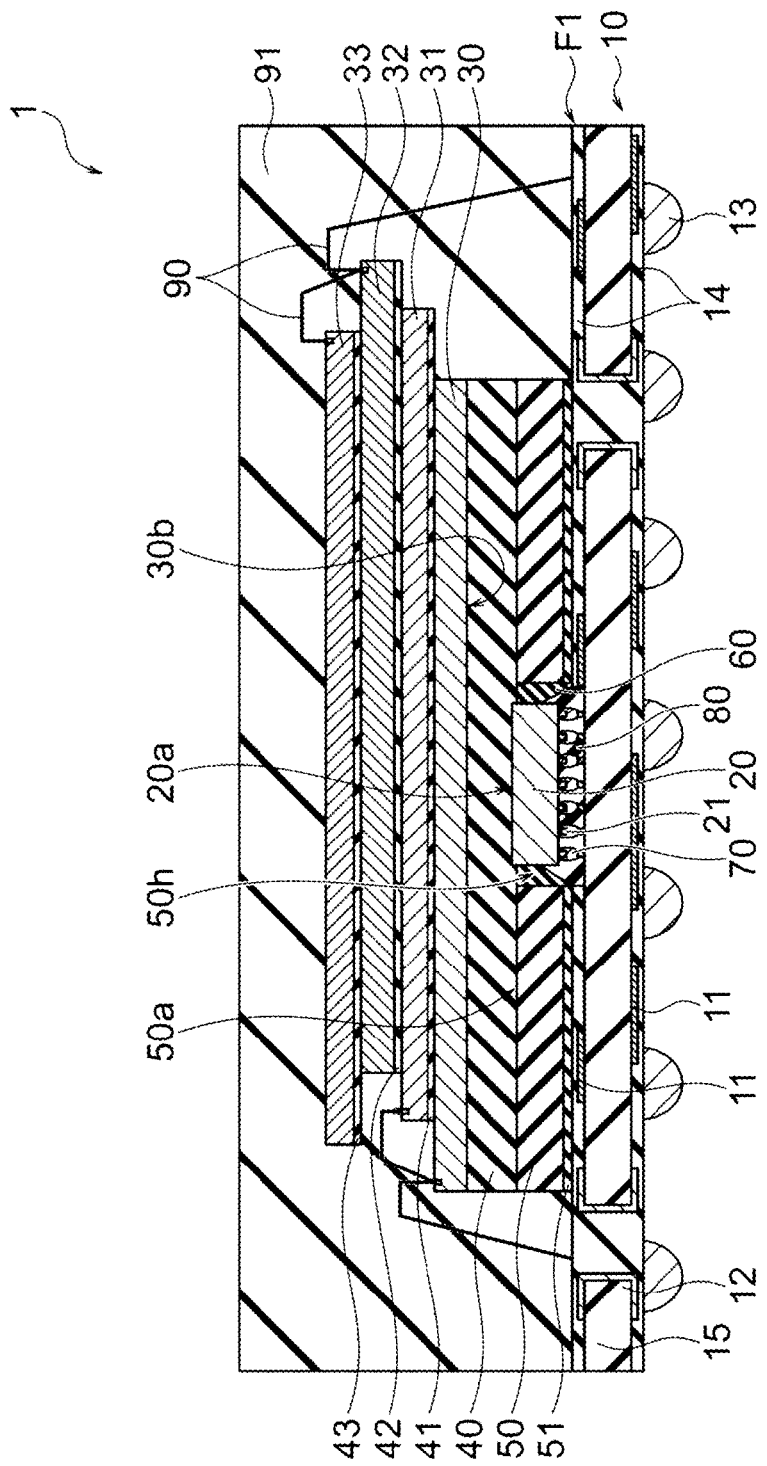
FIG. 1 is a cross-sectional view illustrating an example of configurations of a semiconductor device according to a first embodiment.

FIG. 1 is a cross-sectional view illustrating an example of configurations of a semiconductor device 1 according to a first embodiment. The semiconductor device 1 includes an interconnection substrate 10, semiconductor chips 20 and 30 to 33, adhesive layers 40 to 43, a spacer 50, an adhesive layer 51, an adhesive layer 60, a metal material 70, a resin layer 80, a bonding wire 90, and an encapsulation resin 91. The semiconductor device 1 is, for example, a NAND flash memory package.

The interconnection substrate 10 may be a printed circuit board or an interposer including interconnection layers 11 and an insulating layer 15. For example, any of low resistance metals such as copper, nickel, and alloys thereof is used for the interconnection layers 11. For example, an insulating material such as a glass epoxy resin is used for the insulating layer 15. In FIG. 1, the interconnection layers 11 are provided only on a front surface and a rear surface of the insulating layer 15, respectively. Alternatively, the interconnection substrate 10 may have a multilayer interconnection structure in which a plurality of interconnection layers 11 and a plurality of insulating layers 15 are stacked. The interconnection substrate 10 may have, for example, a through via 12 penetrating a front surface and a rear surface of the interconnection substrate 10 as in the interposer.

A solder resist layer 14 provided on the interconnection layer 11 is provided on the front surface of the interconnection substrate 10. The solder resist layer 14 is an insulating layer that protects the interconnection layer 11 from the metal material 70 and that prevents a short circuit defect.

The solder resist layer 14 provided on the interconnection layer 11 is also provided on the rear surface of the interconnection substrate 10. Metal bumps 13 are provided on the interconnection layer 11 exposed from the solder resist layer 14. The metal bumps 13 are provided for electrically connecting other components, not illustrated, to the interconnection substrate 10.

The semiconductor chip 20 is provided on a front surface-side, i.e., an upper surface-side of the interconnection substrate 10. The semiconductor chip 20 is provided between the interconnection substrate 10 and the adhesive layer 40. The semiconductor chip 20 is, for example, a controller chip that controls the memory chips. A semiconductor element, not illustrated, is provided on a surface, which faces to the interconnection substrate 10, of the semiconductor chip 20. The semiconductor element may be, for example, a CMOS (Complementary Metal Oxide Semiconductor) circuit configuring a controller. Electrode pillars 21 electrically connected to the semiconductor element are provided on the rear surface (lower surface) of the semiconductor chip 20. For example, any of low resistance metals such as copper, nickel, and alloys thereof is used for the electrode pillars 21.

A metal material 70 surrounds each electrode pillar 21 that serves as a connection bump. The electrode pillar 21 is electrically connected to the interconnection layer 11 exposed in an opening of the solder resist layer 14 via the metal material 70. For example, any of low resistance metals such as a solder, silver, and copper is used for the metal material 70. The metal material 70 covers, for example, part of the interconnection layer 11 of the interconnection substrate 10 in the opening and also covers part of side surfaces of the electrode pillar 21 of the semiconductor chip 20. The metal material 70 thereby electrically connects the electrode pillar 21 of the semiconductor chip 20 to the interconnection layer 11 of the interconnection substrate 10.

A resin layer (underfill) 80 surrounds the metal material 70 and between the semiconductor chip 20 and the interconnection substrate 10. The resin layer 80, which is formed from, for example, a hardened NCP (Non-Conductive Paste), covers and protects surroundings of the semiconductor chip 20.

More specifically, in a view from a normal direction of a surface F1 of the interconnection substrate 10, the semiconductor chip 20 is disposed in such a manner that the overall semiconductor chip 20 overlaps the semiconductor chip 30. That is, a chip size of the semiconductor chip 20 is smaller than a chip size of the semiconductor chip 30.

The semiconductor chip 30 adheres onto the semiconductor chip 20 via the adhesive layer 40. Therefore, the semiconductor chip 30 is provided above the upper surface, i.e., surface F1 of the interconnection substrate 10. The semiconductor chip 30 is, for example, a memory chip including a NAND flash memory. The semiconductor chip 30 has semiconductor elements, not illustrated, on a front surface, i.e., upper surface thereof. The semiconductor elements may be, for example, a memory cell array and a peripheral circuit (CMOS circuit) of the memory cell array. The memory cell array may be a stereoscopic memory cell array on which a plurality of memory cells are disposed three-dimensionally. In addition, the semiconductor chip 31 adheres onto the semiconductor chip 30 via the adhesive layer 41. The semiconductor chip 32 adheres onto the semiconductor chip 31 via the adhesive layer 42. The semiconductor chip 33 adheres onto the semiconductor chip 32 via the adhesive layer 43. The semiconductor chips 31 to 33, like the semiconductor chip 30, are each, for example, a memory chip including a NAND flash memory. The semiconductor chips 30 to 33 may be identical memory chips. In FIG. 1, the semiconductor chips 30 to 33 serving as four memory chips are stacked as well as the semiconductor chip 20 serving as the controller chip. Nevertheless, the number of stacked semiconductor chips may be equal to or smaller than three or may be equal to or greater than five.

The spacer 50 covers surroundings of the adhesive layer 60 in the view from the normal direction of the surface F1 of the interconnection substrate 10. The spacer 50 adheres onto the front surface, i.e., upper surface of the interconnection substrate 10 via the adhesive layer 51. The adhesive layer 51 is provided between the interconnection substrate 10 and the spacer 50. In addition, the spacer 50 has a through-hole 50h. The semiconductor chip 20 and the adhesive layer 60 are disposed in the through-hole 50h. A width of the through-hole 50h in the view from the normal direction of the surface F1 of the interconnection substrate 10 is slightly larger than a width of the semiconductor chip 20, as will be described later.

The adhesive layer 60 covers surroundings of the semiconductor chip 20 in the view from the normal direction of the surface F1 of the interconnection substrate 10. The adhesive layer 60 is disposed in such a manner that the overall adhesive layer 60 overlaps the adhesive layer 40 in the view from the normal direction of the surface F1 of the interconnection substrate 10. This is because the adhesive layer 60 is formed by flow off of part of the adhesive layer 40 downward, as will be described later. The adhesive layer 60 covers side surfaces of the semiconductor chip 20 in the through-hole 50h of the spacer 50. That is, the adhesive layer 60 buries a gap between a combination of the semiconductor chip 20 and the resin layer 80, and the spacer 50. It is noted that detailed configurations of the adhesive layer 40, the spacer 50, and the adhesive layer 60 will be described later.

The bonding wire 90 is connected to the interconnection substrate 10 and freely selected pads of the semiconductor chips 30 to 33. To connect the semiconductor chips 30 to 33 by the bonding wire 90, the semiconductor chips 30 to 33 are stacked to be staggered each by as much as a pad. It is noted that the semiconductor chip 20 is not wire bonded since being flip-chip connected by the electrode pillars 21. It is noted that the semiconductor chip 20 may be not only flip-chip connected by the electrode pillars 21 but also wire bonded.

Furthermore, the encapsulation resin 91 encapsulates the semiconductor chips 20 and 30 to 33, the adhesive layers 40 to 43 and 51, the spacer 50, the bonding wire 90, and the like. The semiconductor device 1 is thereby configured as one semiconductor package including the plurality of semiconductor chips 20 and 30 to 33 on the interconnection substrate 10.

Detailed internal configurations of the adhesive layer 40, the spacer 50, and the adhesive layer 60 will next be described.

The adhesive layer 40 is provided on a lower surface, i.e., surface 30b, which is opposed to the interconnection substrate 10, of the semiconductor chip 30. The adhesive layer 40 contains a plurality of types of resins different in molecular weight. The adhesive layer 40 contains, for example, a high-molecular-weight base material and a low-molecular-weight epoxy resin. It is noted that the low-molecular-weight epoxy resin may be a resin at a relatively low softening point or, to be specific, a resin lower in softening point than the base material. The adhesive layer 40 preferably contains the low-molecular-weight epoxy resin at a relatively high compounding ratio. A material for the adhesive layer 40 may be the same as a material for the adhesive layers 41 to 43. The adhesive layer 40 also contains a filler, not illustrated. In addition, when the adhesive layer 40 is thin, an amount of the resin flowing off from the adhesive layer 40 is small and it is possibly difficult to bury the through-hole 50h with the adhesive layer 60. Preferably, the adhesive layer 40 has a thickness enough to be able to bury at least the through-hole 50h. It is noted that the necessary thickness of the adhesive layer 40 possibly varies depending on the material or the like for the adhesive layer 40. The thickness of the adhesive layer 40 is, for example, equal to or larger than half a thickness of the semiconductor chip 20 or half a thickness of a combination of the spacer 50 and the adhesive layer 51.

The adhesive layer 60 contains at least one type of the resin lower in molecular weight than the other resins among the plurality of types of resins contained in the adhesive layer 40. The adhesive layer 60 contains, for example, the low-molecular-weight epoxy resin. Furthermore, a filler concentration of the adhesive layer 60 is lower than a filler concentration of the adhesive layer 40. More specifically, the adhesive layer 60 hardly contains a filler. This is because it is difficult for the high-molecular-weight base material and the high-molecular-weight filler, e.g., silica filler to flow off from the adhesive layer 40 and the base material and the filler, e.g., silica filler remain in the adhesive layer 40.

The spacer 50 supports the semiconductor chip 30 and the adhesive layer 40. In addition, the spacer 50 is relatively high in rigidity. More specifically, the spacer 50 is higher in rigidity than the adhesive layer 40. This enables the spacer 50 to keep a shape even when, for example, being pressurized from a semiconductor chip 30-side at a time of mounting the semiconductor chip 30. The spacer 50 is, for example, a resin layer. Since the resin layer is easier to work, it is possible to facilitate forming the through-hole 50h in which the semiconductor chip 20 is accommodated. A material for the spacer 50 is, for example, polyimide.

Furthermore, a height of an upper surface, i.e., surface 50a, which is opposed to the adhesive layer 40, of the spacer 50 from the surface F1 is smaller than a height of an upper surface, i.e., surface 20a, which is opposed to the adhesive layer 40, of the semiconductor chip 20 from the surface F1. Therefore, the height of the spacer 50 is set in such a manner that part of the semiconductor chip 20 sinks into the adhesive layer 40, as will be described later.

A method of manufacturing the semiconductor device 1 will next be described.

Figure 4:
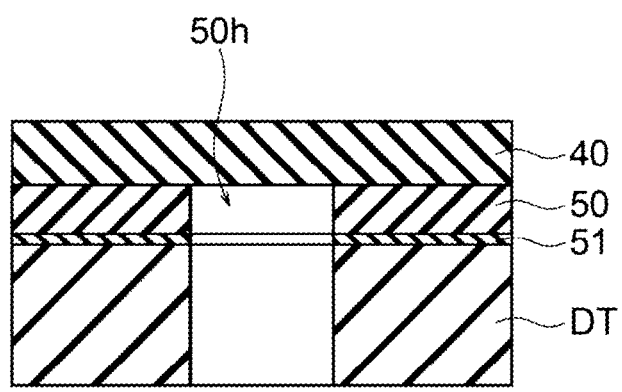
FIG. 4 is a cross-sectional view, subsequent to FIG. 3, illustrating the example of the semiconductor device manufacturing method.
Figure 5:
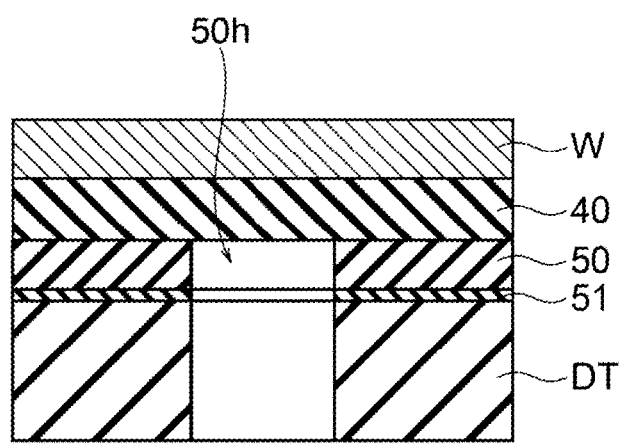
FIG. 5 is a cross-sectional view, subsequent to FIG. 4, illustrating the example of the semiconductor device manufacturing method.
Figure 6:
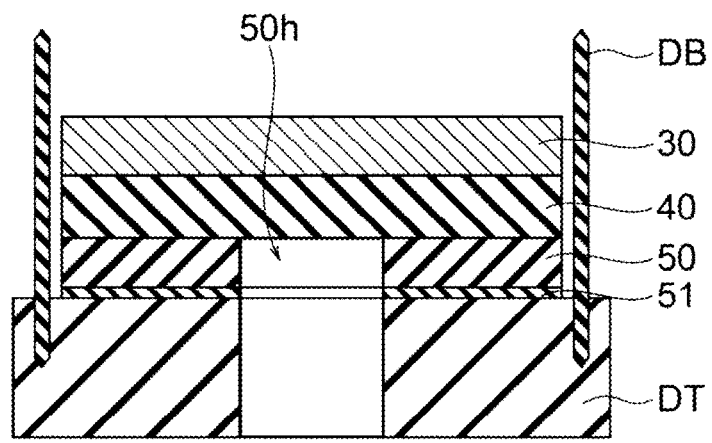
FIG. 6 is a cross-sectional view, subsequent to FIG. 5, illustrating the example of the semiconductor device manufacturing method.
Figure 7:
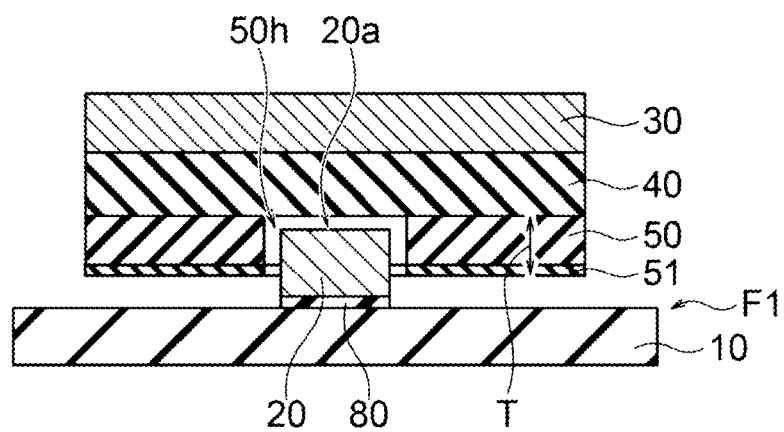
FIG. 7 is a cross-sectional view, subsequent to FIG. 6, illustrating the example of the semiconductor device manufacturing method.
Figure 8:
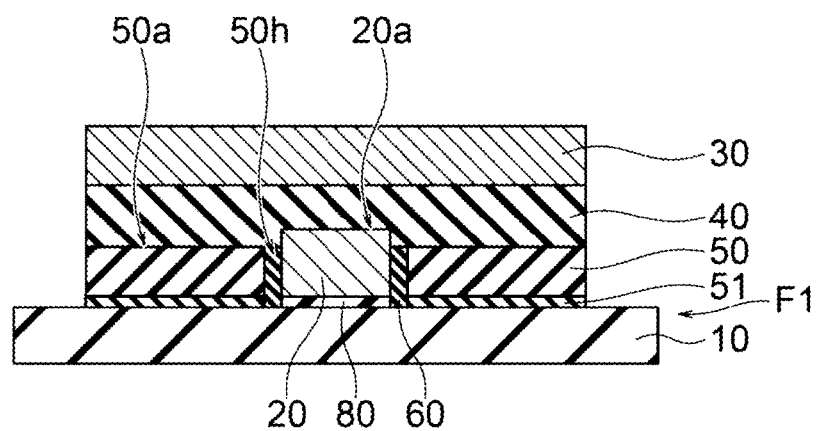
FIG. 8 is a cross-sectional view, subsequent to FIG. 7, illustrating the example of the semiconductor device manufacturing method.

FIGS. 2 to 8 are cross-sectional views illustrating an example of the method of manufacturing the semiconductor device 1 according to the first embodiment. FIGS. 2 to 5 illustrate processes before a semiconductor wafer W is diced. FIGS. 6 to 8 illustrate processes of dicing the semiconductor wafer W into semiconductor chips and mounting each semiconductor chip 30 on the interconnection substrate 10.

Figure 9:
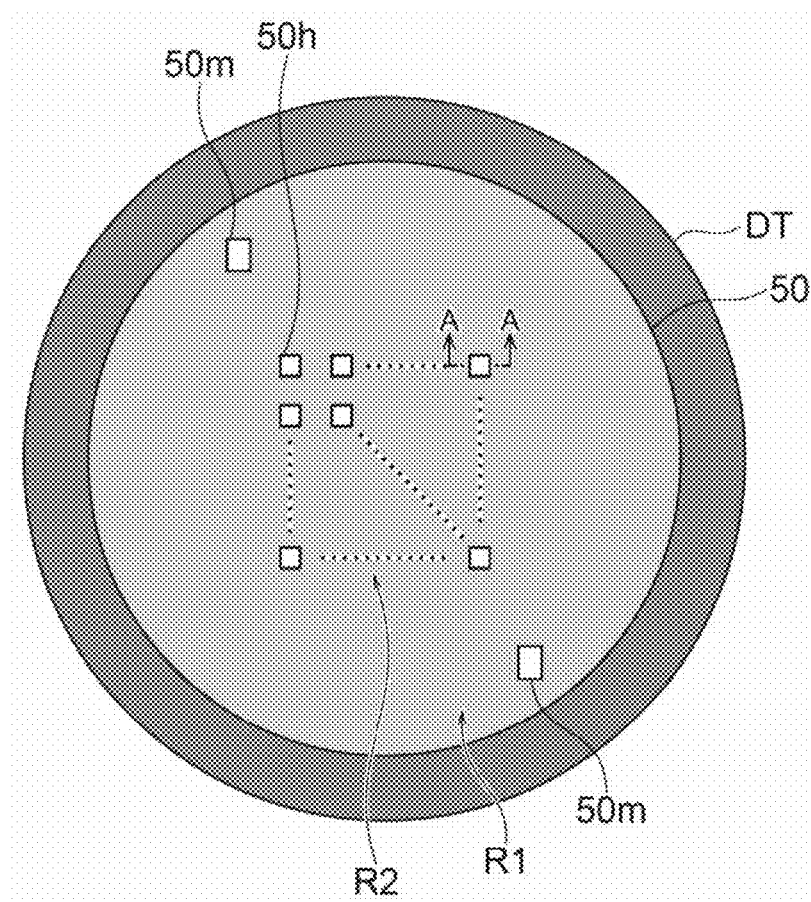
FIG. 9 is a top view illustrating an example of configurations of through-holes of a spacer and surroundings of the through-holes according to the first embodiment.
Figure 10:
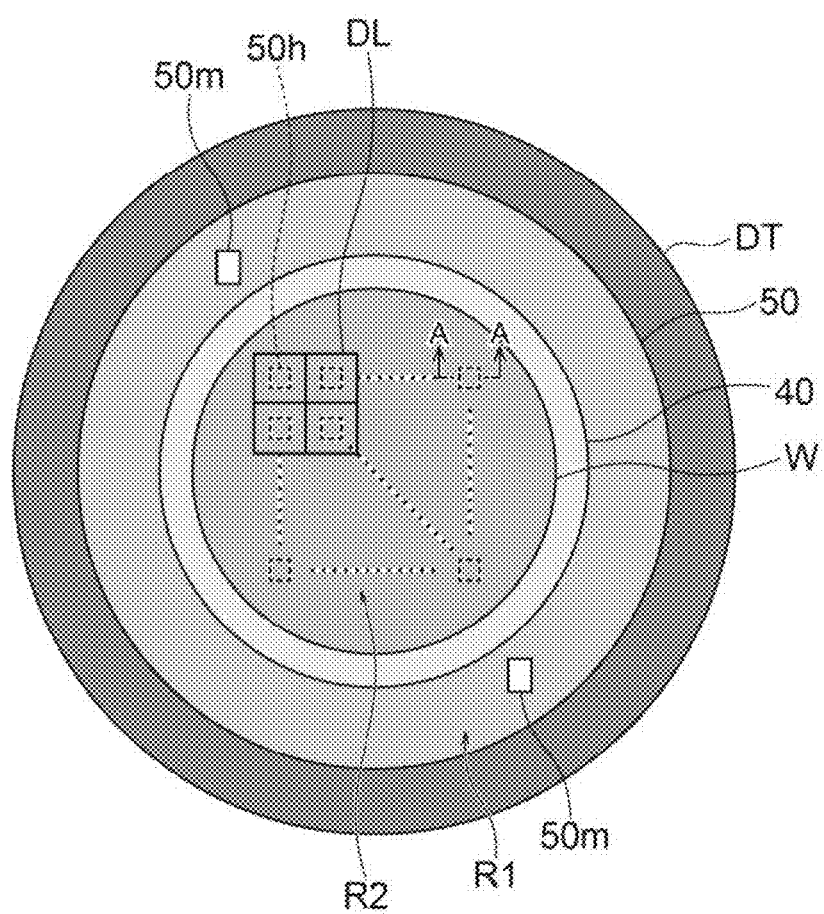
FIG. 10 is a top view illustrating an example of configurations of the semiconductor wafer before dicing and surroundings of the semiconductor wafer according to the first embodiment.

FIG. 9 is a top view illustrating an example of configurations of the through-holes 50h of the spacer 50 and surroundings of the through-holes 50h according to the first embodiment. FIG. 10 is a top view illustrating an example of configurations of the semiconductor wafer W before dicing and surroundings of the semiconductor wafer W according to the first embodiment. FIGS. 2 to 8 are also enlarged cross-sectional views of one through-hole 50h and the surroundings of the through-hole 50h illustrated in FIGS. 9 and 10. Line A-A of FIGS. 9 and 10 is a line along which FIGS. 2 to 8 that are cross-sectional views are taken.

In the example illustrated in FIGS. 9 and 10, the semiconductor wafer W, the adhesive layer 40, the spacer 50, and a dicing tape DT are stacked almost concentrically. As illustrated in FIG. 10, a size of the spacer 50 is larger than a size of the adhesive layer 40. In addition, the size of the adhesive layer 40 is larger than a size of the semiconductor wafer W.

In FIGS. 9 and 10, regions R1 and R2 are regions above the spacer 50. The region R2 is the region where the through-holes 50h are formed, i.e., the region where the adhesive layer 40 and the semiconductor wafer W are provided. It is noted that disposition and the like of the through-holes 50h illustrated in FIGS. 9 and 10 are given by way of example. The region R1 is the region different from the region R2 and outside of the region R2. The region R1 is the region outside of the adhesive layer 40 and the semiconductor wafer W. Marks 50m are provided in the region R1. The marks 50m are wafer lamination marks. The marks 50m are used to position the semiconductor wafer W so that positions of semiconductor elements formed on the semiconductor wafer W correspond to positions of the through-holes 50h.

Figure 2:
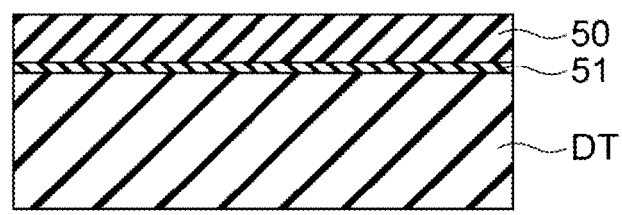
FIG. 2 is a cross-sectional view illustrating an example of a semiconductor device manufacturing method according to the first embodiment.

First, as illustrated in FIG. 2, the spacer 50 is made to adhere onto the dicing tape DT via the adhesive layer 51. For example, the spacer 50 having the adhesive layer 51 provided in advance is provided on the dicing tape DT.

Figure 3:
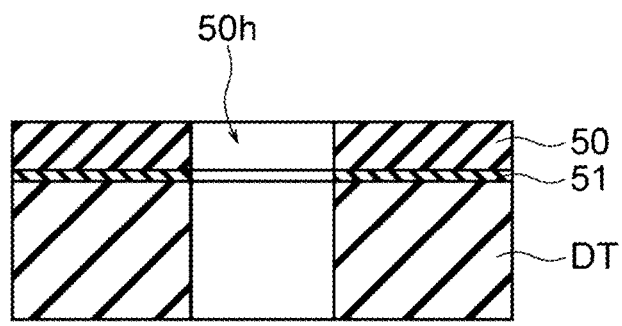
FIG. 3 is a cross-sectional view, subsequent to FIG. 2, illustrating the example of the semiconductor device manufacturing method.

Next, as illustrated in FIG. 3, each through-hole 50h is formed in the spacer 50. The through-hole 50h is formed to penetrate the dicing tape DT, the adhesive layer 51, and the spacer 50. The through-hole 50h is formed by, for example, punching part of the dicing tape DT, the adhesive layer 51, and the spacer 50 by a mold from a vertical direction of FIG. 3.

It is noted that the position of each through-hole 50h is set in response to the position of each semiconductor element formed on the semiconductor wafer W. That is, the position of the through-hole 50h is set in response to the position of each semiconductor chip 30 before dicing.

More specifically, before formation of each through-hole 50h, the two marks 50m are formed in the region R1 illustrated in FIG. 9. The marks 50m are, for example, through-holes. Subsequently, a plurality of through-holes 50h are formed in the region R2 with reference to positions of the two marks 50m. That is, the through-holes 50h are formed at the positions with reference to the positions of the two marks 50m.

Next, as illustrated in FIG. 4, the adhesive layer 40 is provided on the spacer 50. Since the adhesive layer 40 is provided after forming the through-holes 50h, the through-holes 50h are not provided in the adhesive layer 40.

Next, as illustrated in FIG. 5, the semiconductor wafer W is provided on the adhesive layer 40. More specifically, the semiconductor wafer W is provided on the adhesive layer 40 in response to the positions of the plurality of through-holes 50h. The semiconductor elements of the semiconductor chips 30 are provided on an upper surface of the semiconductor wafer W. A lower surface of the semiconductor wafer W is subjected to backgrinding so that the semiconductor wafer W has a desired thickness.

When the adhesive layer 40 is disposed herein on the spacer 50, visibility to the through-holes 50h decreases. The semiconductor wafer W is, therefore, provided in the region R2 with reference to the positions of the marks 50m disposed in the region R1 illustrated in FIG. 10. That is, the marks 50m are disposed apart from the through-holes 50h, so that it is possible to determine an appropriate position of mounting the semiconductor wafer W on the basis of the marks 50m.

Next, as illustrated in FIG. 6, the semiconductor wafer W is diced into semiconductor chips 30. The semiconductor wafer W is diced using, for example, dicing blades DB. The adhesive layer 40, the spacer 50, and the adhesive layer 51 are also diced together with the semiconductor wafer W. The semiconductor wafer W is cut into a chip size along a dicing line DL illustrated in FIG. 10. It is noted that FIG. 10 illustrates part of the dicing line DL.

Next, as illustrated in FIG. 7, the semiconductor chip 30 is made to adhere onto the interconnection substrate 10 via the adhesive layer 51. In FIG. 7, the semiconductor chip 20 is mounted on the surface F1 of the interconnection substrate 10 in advance. Therefore, the adhesive layer 51, the spacer 50, the adhesive layer 40, and the semiconductor chip 30 are provided on the surface F1 so that the semiconductor chip 20 is located in the through-hole 50h.

Moreover, in FIG. 7, the interconnection substrate 10 and the semiconductor chip 20 are heated. The interconnection substrate 10 and the semiconductor chip 20 are heated using, for example, a heater, not illustrated, provided below the interconnection substrate 10.

Furthermore, a thickness T of the combination of the spacer 50 and the adhesive layer 51 is smaller than the thickness of the semiconductor chip 20. The upper surface, i.e., surface 20a of the semiconductor chip 20 thereby comes in contact with the adhesive layer 40 before the adhesive layer 51 comes in contact with the interconnection substrate 10. This facilitates transferring heat from the heater provided on an interconnection substrate 10-side to the adhesive layer 40.

Next, as illustrated in FIG. 8, the adhesive layer 60 is formed to bury the through-hole 50h. The semiconductor chip 30 obtained by dicing is mounted on the interconnection substrate 10 at a predetermined pressure. The adhesive layer 40 and the spacer 50 are thereby pressurized. In addition, the heat from the heater provided on the interconnection substrate 10-side is transferred to the adhesive layer 40 via the interconnection substrate 10 and the semiconductor chip 20.

When the adhesive layer 40 is heated, part of the resins contained in the adhesive layer 40 are melted. The low-molecule-weight component resin among the resins in the adhesive layer 40 tends to be melted by the heat. The melted resin flows off (distills) from the adhesive layer 40 and buries the through-hole 50h in response to the pressure during mounting. That is, by heating and pressurizing the adhesive layer 40, the adhesive layer 60 is formed in the through-hole 50h. It is noted that a main component of the adhesive layer 60 is the low-molecular-weight epoxy resin since it is difficult for the high-molecular-weight base material and the high-molecular-weight filler to flow off from the adhesive layer 40.

The interconnection substrate 10 is heated at a temperature, for example, equal to or lower than 200° C. The interconnection substrate 10 may be heated at a temperature, for example, equal to or lower than 150° C. depending on the material for the adhesive layer 40.

Furthermore, as illustrated in FIG. 8, the height from the surface F1 of the interconnection substrate 10 to the surface 50a of the spacer 50 is smaller than the height from the surface F1 of the interconnection substrate 10 to the surface 20a of the semiconductor chip 20. In the process illustrated in FIG. 8, it is thereby possible that the upper surface of the semiconductor chip 20 presses the adhesive layer 40 to facilitate transferring the heat to the adhesive layer 40. As a result, the adhesive layer 60 can flow off from the adhesive layer 40 easily. Furthermore, it is possible to reduce a possibility of generating a gap between the upper surface of the semiconductor chip 20 and the adhesive layer 40 and, therefore, further facilitates burying the through-hole 50h with the adhesive layer 60. It is noted that the spacer 50 is less prone to deformation even receiving the heat due to the high rigidity and the height of the spacer 50 can be maintained.

After the process illustrated in FIG. 8, the semiconductor chips 31 to 33, the adhesive layers 41 to 43, and the bonding wire 90 are provided. Subsequently, the elements such as the semiconductor chips 20 and 31 to 33 are encapsulated with the encapsulation resin 91, thereby completing the semiconductor device 1 illustrated in FIG. 1.

As described so far, according to the first embodiment, the adhesive layer 60 flows off from the adhesive layer 40 to bury the through-hole 50h of the spacer 50. The adhesive layer 60, therefore, surrounds the semiconductor chip 20 disposed in the through-hole 50h. It is thereby possible to bury the semiconductor chip 20 with the adhesive layer 60 more appropriately and mount (dispose) the semiconductor chip 30 on the interconnection substrate 10 and the semiconductor chip 20 more appropriately.

Furthermore, in the view from the normal direction of the surface F1 of the interconnection substrate 10, the width of the through-hole 50h is larger than the width of the semiconductor chip 20. If the width of the through-hole 50h is nearly the same as that of the semiconductor chip 20, the spacer 50 possibly interferes with the semiconductor chip 20 in the process illustrated in FIG. 7. If the width of the through-hole 50h is sufficiently larger than that of the semiconductor chip 20, a gap widens between the semiconductor chip 20 and the spacer 50 in the through-hole 50h. In this case, the through-hole 50h (gap) may be difficult to bury with the adhesive layer 60. It is, therefore, preferable that the width of the through-hole 50h is slightly larger than the width of the semiconductor chip 20. The width of the through-hole 50h is set larger than the width of the semiconductor chip 20 in consideration of, for example, position accuracy. The position accuracy includes, for example, position accuracy for the through-hole 50h and position accuracy at the time of mounting the semiconductor chips 20 and 30. The width of the through-hole 50h is set, for example, larger than the width of the semiconductor chip 20 by a predetermined value, e.g., 100 μm.

As a comparison, there is a structure of burying the semiconductor chip 20 with a thick adhesive layer, e.g., DAF (Die Attach Film) provided on the lower surface of the semiconductor chip 30. With this structure, however, a region of an adhesive portion between the adhesive layer and the interconnection substrate 10 shrinks when, for example, the size of the semiconductor chip 30 is relatively small or when the size of the semiconductor chip 30 is closer to the size of the semiconductor chip 30. As the region of the adhesive portion is smaller, the semiconductor chip 30 becomes more prone to being inclined and the adhesive layer becomes more prone to being peeled off from the interconnection substrate 10 during curing. Furthermore, a thickness of the adhesive layer with which the semiconductor chip 20 is buried increases since the semiconductor chip 30 is difficult to be thinned and a height of connection with the interconnection substrate 10 is necessary when the semiconductor chip 20 is flip-chip connected. That is, when the size of the semiconductor chip 30 is relatively small, the structure of burying the semiconductor chip 20 with the thick adhesive layer is difficult to adopt.

According to the first embodiment, by contrast, the spacer 50 surrounds the semiconductor chip 20. The semiconductor chip 30 becomes prone to warp as being thinner. The spacer 50 supports the semiconductor chip 30 so that the semiconductor chip 30 is made flat. In addition, since the spacer 50 supports the semiconductor chip 30, even the thinner semiconductor chip 30 is capable of preventing occurrence of a warp or the like. Furthermore, since the spacer 50 supports the semiconductor chip 30, it is possible to prevent an inclination of the semiconductor chip 30. Moreover, because of no difference in height by the semiconductor chip 20, a lower surface of the spacer 50 adheres onto the interconnection substrate 10 via the adhesive layer 51 appropriately. It is thereby possible to mount the semiconductor chip 30 more appropriately even when the size of the semiconductor chip 30 is relatively small.

Moreover, as a comparison, there is a method of individually providing a plurality of spacer chips on sides of the semiconductor chip 20. Examples of a material for the spacer chips include silicon (Si) and polyimide. At this time, a gap between the spacer chips and the semiconductor chip 20 is larger than the gap in the present embodiment. Due to this, even when the semiconductor chip 30 and the adhesive layer 40 are subsequently stacked, the gap cannot be buried only with the adhesive layer 60 flowing off from the adhesive layer 40. Moreover, when the gap is subsequently buried with the encapsulation resin 91 and if heights of the spacer chips and the semiconductor chip 20 are small, flowability of the resin decreases to make it impossible to completely bury the gap with the encapsulation resin 91. Alternatively, when the spacer chips are set higher for ensuring the flowability of the encapsulation resin 91, it is impossible to realize miniaturization.

Alternatively, when thinner spacer chips are used for ensuring the flowability of the encapsulation resin 91, the gap between the semiconductor chip 20 and the spacer chips further widens. At this time, if the semiconductor chip 30 is thin and the semiconductor chip 30 is stacked on the spacer chips, the semiconductor chip 30 is prone to being warped and is sometimes broken due to the wide gap. Moreover, using the spacer chips increases cost and requirements, i.e., necessary conditions for a chip stacking device.

According to the first embodiment, by contrast, the adhesive layer 60 buries the gap, i.e., through-hole 50h between the semiconductor chip 20 and the spacer 50. Therefore, the gap can be buried more easily than the case of using the encapsulation resin 91. Furthermore, it is possible to make the semiconductor chip 30 and the spacer 50 thinner and further reduce a package height.

It is noted that the spacer 50 is not limited to the resin layer. As the material for the spacer 50, a material relatively high in rigidity for maintaining the height of the spacer 50 and easy to work for forming the through-hole 50h may be used.

Moreover, the height from the surface F1 of the interconnection substrate 10 to the surface 50a of the spacer 50 may be larger than the height from the surface F1 of the interconnection substrate 10 to the surface 20a of the semiconductor chip 20. In this case, the heat is transferred from the interconnection substrate 10 to the adhesive layer 40 via the spacer 50 at the time of mounting the semiconductor chip 30. In addition, the height of the semiconductor chip 20 is small, so that the adhesive layer 60 may also be provided between the upper surface of the semiconductor chip 20 and the adhesive layer 40.

Moreover, the spacer 50 has adhesion properties and may be directly adhesively bonded with the interconnection substrate 10. In this case, the adhesive layer 51 may not be provided.

Furthermore, in the processes of manufacturing the semiconductor device 1, the spacer 50 (and the adhesive layer 51) in which the marks 50m and the through-hole 50h are formed in advance may be used. In this case, it is possible to omit the processes of forming the marks 50m and the through-hole 50h.

Furthermore, the adhesive layer 40 may be heated from not the interconnection substrate 10-side but a semiconductor chip 30-side. In this case, a heater is provided, for example, in a collet used to convey the semiconductor chip 30. Furthermore, the heater may be provided in each of the interconnection substrate 10 and the collet.

Second Embodiment

FIGS. 11 to 14 are cross-sectional views illustrating an example of a method of manufacturing the semiconductor device 1 according to a second embodiment.

In the first embodiment, the through-hole 50h is formed in the processes of preparing the adhesive layer 40, the spacer 50, and the adhesive layer 51 as one adhesive layer, as illustrated in FIGS. 2 to 4. The adhesive layer 40, the spacer 50, and the adhesive layer 51 are subsequently bonded onto the semiconductor wafer W as one adhesive layer. In this case, the already formed through-hole 50h is possibly unable to correspond to, for example, a change in specifications such as the sizes of the semiconductor chips 20 and 30, possibly resulting in waste of the material. On the other hand, the second embodiment differs from the first embodiment in that the through-hole 50h is formed in an assembly process.

Figure 11:
FIG. 11 is a cross-sectional view illustrating an example of a semiconductor device manufacturing method according to a second embodiment.
Figure 11:
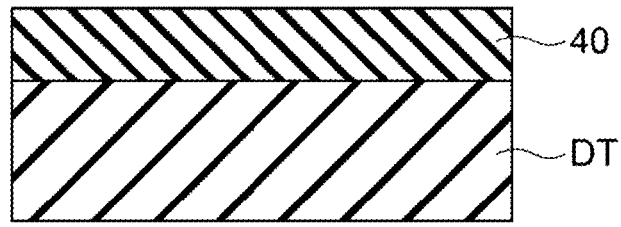
Figure 12:
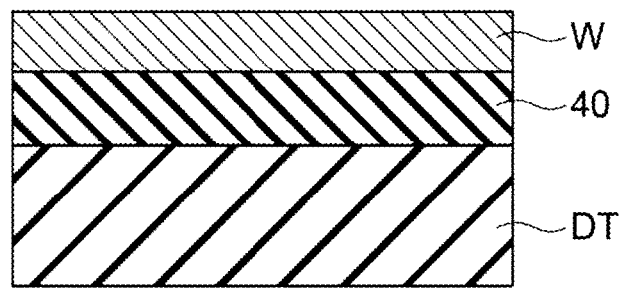
FIG. 12 is a cross-sectional view, subsequent to FIG. 11, illustrating the example of the semiconductor device manufacturing method.
Figure 13:
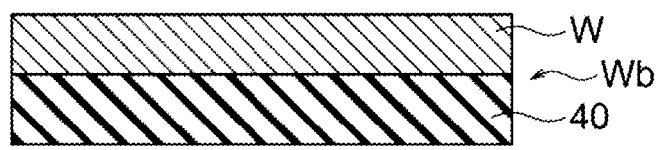
FIG. 13 is a cross-sectional view, subsequent to FIG. 12, illustrating the example of the semiconductor device manufacturing method.

First, as illustrated in FIG. 11, the adhesive layer 40 is provided on the dicing tape DT. Next, as illustrated in FIG. 12, the semiconductor wafer W is made to adhere onto the adhesive layer 40. Next, as illustrated in FIG. 13, the dicing tape DT is peeled off from the semiconductor wafer W and the adhesive layer 40. The adhesive layer 40 is thereby provided on a lower surface, i.e., surface Wb that is one of surfaces of the semiconductor wafer W.

Figure 14:
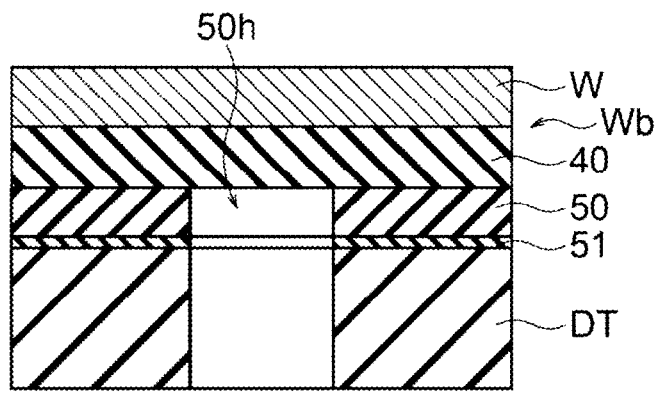
FIG. 14 is a cross-sectional view, subsequent to FIG. 13, illustrating the example of the semiconductor device manufacturing method.

Next, as illustrated in FIG. 14, the semiconductor wafer W is made to adhere onto the spacer 50 via the adhesive layer 40 provided on the surface Wb. More specifically, the adhesive layer 60 and the semiconductor wafer W are provided on the spacer 50 having the plurality of through-holes 50h in response to the positions of the plurality of through-holes 50h.

The through-holes 50h are formed herein similarly to FIGS. 2 and 3 according to the first embodiment. It is noted that the through-holes 50h are formed in response to the size of at least one of the semiconductor chip 30 and the semiconductor chip 20 in an actual assembly process of the package (product). It is thereby possible to form the through-holes 50h in response to, for example, the change in specifications of the chip sizes or the like. As a result, it is possible to reduce waste of the materials for the spacer 50, the adhesive layer 51, and the like due to, for example, the change in specifications. The through-holes 50h may be formed before the process illustrated in FIG. 14 and may be formed, for example, in parallel to providing the adhesive layer 40 on the semiconductor wafer W.

After the process illustrated in FIG. 14, the semiconductor device 1 illustrated in FIG. 1 is completed through similar processes to those illustrated in FIG. 6 and the following according to the first embodiment.

The semiconductor device 1 according to the second embodiment can obtain similar effects to those of the first embodiment. Furthermore, according to the second embodiment, it is possible to form the through-holes 50h to correspond to the semiconductor chips 20 and 30 at the time of the actual assembly of the package (product) as described above.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a substrate having a first surface;
   a first semiconductor chip disposed above the first surface;
   a first adhesive layer disposed on a lower surface of the first semiconductor chip, facing the substrate, the first adhesive layer containing a plurality of resins different in molecular weight from each other;
   a second semiconductor chip disposed between the substrate and the first adhesive layer;
   a second adhesive layer surrounding the second semiconductor chip as viewed from a normal direction of the first surface, the second adhesive layer containing at least one type of the resin lower in molecular weight than the other resins among the plurality of types of resins contained in the first adhesive layer;
   a spacer surrounding the second adhesive layer in the view from the normal direction of the first surface; and
   a sealing resin, different from the first adhesive layer and the second adhesive layer, covering the first semiconductor chip and the substrate;
   wherein the second adhesive layer only directly contacts a side surface of the second semiconductor chip.

2. The semiconductor device according to claim 1, wherein
   the second semiconductor chip is disposed such that the overall second semiconductor chip overlaps the first semiconductor chip as viewed from the normal direction of the first surface, and
   the second adhesive layer disposed such that the overall second adhesive layer overlaps the first adhesive layer in the view from the normal direction of the first surface.

3. The semiconductor device according to claim 1, wherein
   the spacer supports the first semiconductor chip and the first adhesive layer, and the spacer has a rigidity higher than a rigidity of the first adhesive layer.

4. The semiconductor device according to claim 1, wherein
   the spacer is a resin layer.

5. The semiconductor device according to claim 1, wherein
   the first adhesive layer and the second adhesive layer each include a filler, and
   a concentration of the filler in the second adhesive layer is lower than a concentration of the filler in the first adhesive layer.

6. The semiconductor device according to claim 1, wherein
   from the first surface, a height of an upper surface of the spacer, the upper surface being opposed the first adhesive layer, is smaller than a height of an upper surface of the second semiconductor chip.

7. The semiconductor device according to claim 1, wherein the substrate is an interconnection substrate.

8. The semiconductor device according to claim 1, wherein the first semiconductor chip is a memory chip.

9. The semiconductor device according to claim 8, wherein the first semiconductor chip is a NAND flash memory chip.

10. The semiconductor device according to claim 8, wherein the second semiconductor chip is a memory controller chip.

11. The semiconductor device according to claim 1, wherein the spacer is formed of polyimide.

12. The semiconductor device according to claim 1, wherein the first adhesive layer contains a high-molecular-weight base material and a low-molecular-weight epoxy resin relative to the base material.

13. The semiconductor device according to claim 1, wherein the first adhesive layer has a thickness equal to or larger than one half a thickness of the second semiconductor chip.

* * * * *